United States Patent
Lim et al.

(10) Patent No.: US 11,705,884 B2
(45) Date of Patent: Jul. 18, 2023

(54) BULK ACOUSTIC RESONATOR

(71) Applicant: Samsung Electro-Mechanics Co., Ltd., Suwon-si (KR)

(72) Inventors: Chang Hyun Lim, Suwon-si (KR); Sang Hyun Yi, Suwon-si (KR); Yong Suk Kim, Suwon-si (KR); Sung Jun Lee, Suwon-si (KR); Jae Hyoung Gil, Suwon-si (KR); Dong Hyun Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 83 days.

(21) Appl. No.: 16/942,913

(22) Filed: Jul. 30, 2020

(65) Prior Publication Data
US 2021/0313955 A1  Oct. 7, 2021

(30) Foreign Application Priority Data
Apr. 3, 2020  (KR) .................. 10-2020-0040838

(51) Int. Cl.
*H03H 9/13* (2006.01)
*H03H 9/17* (2006.01)
*H03H 9/02* (2006.01)

(52) U.S. Cl.
CPC ........ *H03H 9/131* (2013.01); *H03H 9/02086* (2013.01); *H03H 9/02118* (2013.01); *H03H 9/17* (2013.01); *H03H 9/173* (2013.01)

(58) Field of Classification Search
CPC ............ H03H 9/131; H03H 9/17; H03H 3/04; H03H 9/02094; H03H 9/173; H03H 9/02118; H03H 9/02157; H03H 2003/0442; H03H 9/02086; H03H 9/178; H03H 9/2405

USPC .......................... 333/133, 187, 188
See application file for complete search history.

(56) References Cited

U.S. PATENT DOCUMENTS

| | | | |
|---|---|---|---|
| 8,330,556 B2 | 12/2012 | Miller et al. | |
| 2005/0140247 A1* | 6/2005 | Lee ..................... | H03H 9/02149 310/320 |
| 2006/0202781 A1* | 9/2006 | Pahl ..................... | H03H 9/0585 333/193 |
| 2011/0037539 A1* | 2/2011 | Jansman ................ | H03H 9/175 333/187 |
| 2018/0254764 A1* | 9/2018 | Lee ..................... | H03H 9/174 |
| 2019/0058451 A1* | 2/2019 | Lee ..................... | H03H 9/175 |

(Continued)

FOREIGN PATENT DOCUMENTS

| | | |
|---|---|---|
| JP | 5111307 B2 | 1/2013 |
| JP | 5262553 B2 | 8/2013 |

OTHER PUBLICATIONS

Webster, http://www.merriam-webster.com/, Definition of "cover" Accessed on May 20, 2022 (Year: 2022).*

*Primary Examiner* — Rakesh B Patel
*Assistant Examiner* — Jorge L Salazar, Jr.
(74) *Attorney, Agent, or Firm* — NSIP Law (57) ABSTRACT

A bulk acoustic resonator includes: a substrate; a first electrode disposed on the substrate; a piezoelectric layer disposed to cover at least a portion of the first electrode; a second electrode disposed to cover at least a portion of the piezoelectric layer; a metal pad connected to the first electrode and the second electrode; and a protective layer disposed to cover at least the metal pad.

21 Claims, 6 Drawing Sheets

(56) References Cited

U.S. PATENT DOCUMENTS

2020/0007111 A1* 1/2020 Stokes .................. H03H 9/105
2021/0184643 A1* 6/2021 Yang ..................... H03H 9/173

* cited by examiner

BULK ACOUSTIC RESONATOR

CROSS-REFERENCE TO RELATED APPLICATIONS

This application claims the benefit under 35 U.S.C. § 119(a) of Korean Patent Application No. 10-2020-0040838 filed on Apr. 3, 2020 in the Korean Intellectual Property Office, the entire disclosure of which is incorporated herein by reference for all purposes.

BACKGROUND

1. Field

The following description relates to a bulk acoustic resonator.

2. Description of Related Art

Generally, a trimming process for adjusting a frequency characteristic may be required in a process of manufacturing a bulk acoustic resonator. A trimming process is performed to adjust a frequency characteristic in a wafer, which may have distribution due to deposition or etching process distribution of each layer. In the case of a filter including a series/shunt (Se/Sh) resonator, a trimming process may be required to tune a filter waveform to adjust a frequency characteristic of each of different types of series/shunt resonators.

However, there may be an issue in which by-products of a passivation layer removed in a trimming process may be stacked on an internal side surface of a metal pad.

Further, a thickness of a passivation layer may be non-uniformly formed in an active region by the trimming process.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic resonator includes: a substrate; a first electrode disposed on the substrate; a piezoelectric layer disposed to cover at least a portion of the first electrode; a second electrode disposed to cover at least a portion of the piezoelectric layer; a metal pad connected to the first electrode and the second electrode; and a protective layer disposed to cover at least the metal pad.

The protective layer may be formed of any one of aluminum oxide (Al2O3), aluminum nitride (AlN), silicon nitride (SiN), and silicon oxide (SiO2).

The protective layer may be disposed outside of an active region in which the first electrode, the piezoelectric layer, and the second electrode overlap one another.

The bulk acoustic resonator may further include: an adhesive layer disposed between the protective layer and the metal pad.

The adhesive layer may be formed of any one of aluminum oxide (Al2O3) and aluminum nitride (AlN). The protective layer may be formed of any one of silicon nitride (SiN) and silicon oxide (SiO2).

The bulk acoustic resonator may further include: an insertion layer disposed between the first electrode and the piezoelectric layer.

The bulk acoustic resonator may further include: a membrane layer forming a cavity with the substrate.

The bulk acoustic resonator may further include: an etch stop portion disposed to surround the cavity; and a sacrificial layer disposed to surround the etch stop portion.

The membrane layer may include an inclined portion disposed slantingly with respect to a surface of the substrate on which the membrane layer is disposed, and a plane portion disposed parallel to the upper surface of the substrate, in an active region in which the first electrode, the piezoelectric layer, and the second electrode overlap one another.

The second electrode may include a frame disposed on an edge of the active region and having a thickness greater than a thickness of other portions of the second electrode.

The substrate may include at least an insulating layer disposed below the cavity.

The metal pad may include a first metal pad connected to the first electrode, and a second metal pad connected to the second electrode.

In another general aspect, a bulk acoustic resonator includes: a substrate; a first electrode disposed on the substrate; a piezoelectric layer disposed to cover at least a portion of the first electrode; a second electrode disposed to cover at least a portion of the piezoelectric layer; a metal pad connected to the first electrode and the second electrode; and a passivation layer disposed to cover the first electrode, a portion of piezoelectric layer disposed on an external side of the first electrode, and the metal pad.

The bulk acoustic resonator may further include an adhesive layer disposed between the metal pad and the passivation layer.

The adhesive layer may be formed of an insulating material or a metal material.

The passivation layer may be formed of a dielectric layer containing any one of silicon nitride (Si3N4), silicon oxide (SiO2), manganese oxide (MgO), zirconium oxide (ZrO2), aluminum nitride (AlN), lead zirconate titanate (PZT), gallium arsenide (GaAs), hafnium oxide (HfO2), aluminum oxide (Al2O3), titanium oxide (TiO2), and zinc oxide (ZnO).

The bulk acoustic resonator of may further include: an adhesive layer disposed between the metal pad and the passivation layer, and formed of either one of aluminum oxide (Al2O3) and aluminum nitride (AlN).

The passivation layer may be further disposed to cover the second electrode.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," "lower," "front," "rear," and "side" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. For another example, if the device in the figures is turned around, an element described as being "front" relative to another element will then be "rear" relative to the other element. Thus, the term "front" encompasses both the front and rear orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
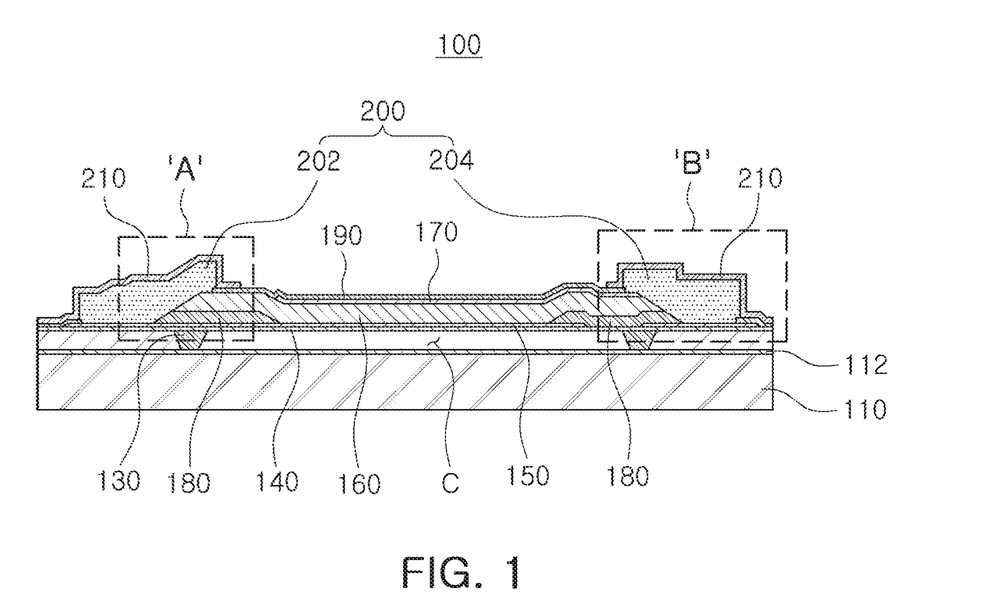
FIG. 1 is a cross-sectional diagram illustrating a bulk acoustic resonator, according to an embodiment.
Figure 2:
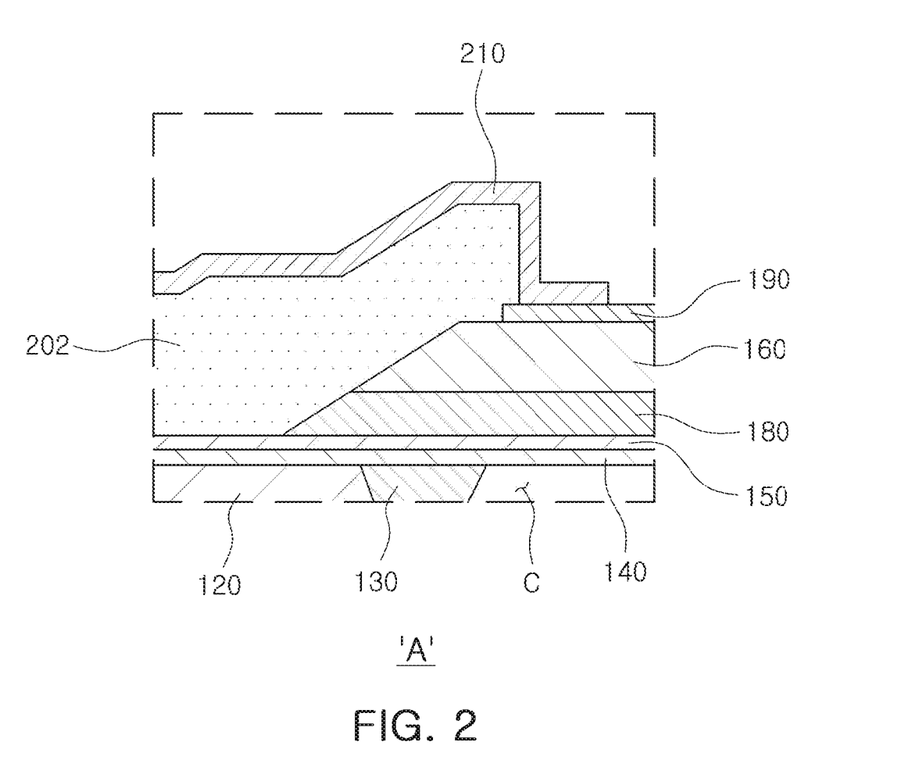
FIG. 2 is an enlarged diagram illustrating portion A of FIG. 1.
Figure 3:
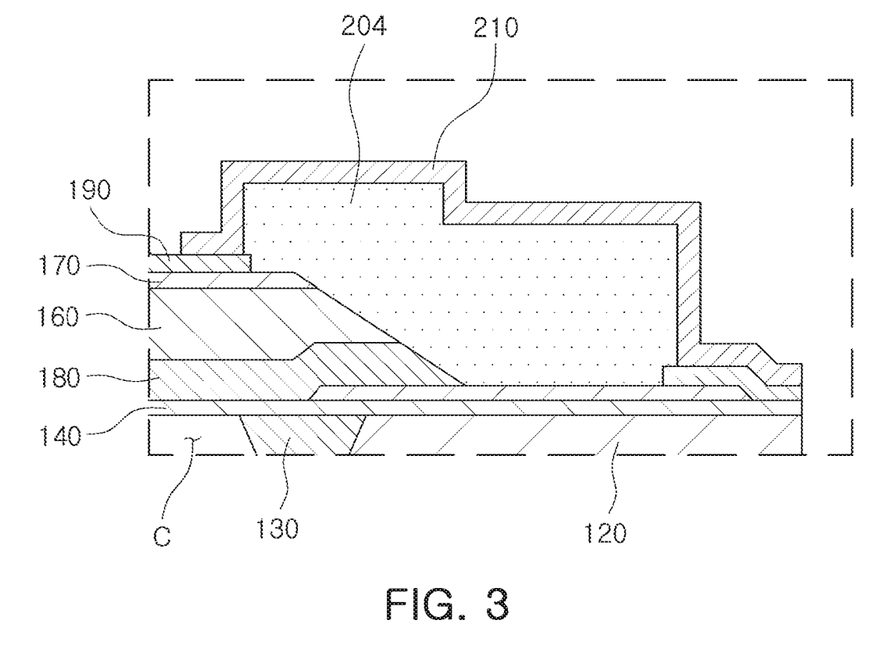
FIG. 3 is an enlarged diagram illustrating portion B of FIG. 1.

FIG. 1 is a cross-sectional diagram illustrating a bulk acoustic resonator 100, according to an embodiment. FIG. 2 is an enlarged diagram illustrating portion A of FIG. 1. FIG. 3 is an enlarged diagram illustrating portion B of FIG. 1.

Referring to FIGS. 1 to 3, the bulk acoustic resonator 100 may include, for example, a substrate 110, a sacrificial layer 120, an etch stop portion 130, a membrane layer 140, a first electrode 150, a piezoelectric layer 160, a second electrode 170, an insertion layer 180, a passivation layer 190, a metal pad 195, and a protective layer 210.

The substrate 110 may be a silicon substrate. For example, a silicon wafer or a silicon on insulator (SOI) type substrate may be used as the substrate 110.

An insulating layer 112 may be formed on an upper surface of the substrate 110, and the insulating layer 112 may electrically isolate elements disposed on an upper surface of the substrate 110 from the substrate 110. Also, when the insulating layer 112 forms a cavity C in a manufacturing process, the insulating layer 112 may prevent the substrate 110 from being etched by an etching gas.

In this example, the insulating layer 112 may be formed of any one or any combination of any two or more of silicon oxide ($SiO_2$), silicon nitride ($Si_3N_4$), aluminum oxide ($Al_2O_3$), and aluminum nitride (AlN), and may be formed through any one of a chemical vapor deposition process, an RF magnetron sputtering process, and an evaporation process.

The sacrificial layer 120 may be formed on the insulating layer 112, and the cavity C and the etch stop portion 130 may be disposed on an internal side of the sacrificial layer 120. The cavity C may be formed by partially removing the sacrificial layer 120 in a manufacturing process. Since the cavity C is formed on an internal side of the sacrificial layer 120, a portion of the first electrode 150 disposed on the sacrificial layer 120, and portions of other layers disposed on the sacrificial layer, may be disposed evenly.

The etch stop portion 130 may be disposed along a boundary of the cavity C. The etch stop portion 130 may prevent etching beyond a cavity region in a process of forming the cavity C.

The membrane layer 140 may form a cavity C with the substrate 110. The membrane layer 140 may also be formed of a material having low reactivity with an etching gas when the sacrificial layer 120 is removed. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide (HfO2), aluminum oxide ($Al_2O_3$), titanium oxide ($TiO_2$), and zinc oxide (ZnO), may be used as the membrane layer 140, for example.

A seed layer (not illustrated) formed of aluminum nitride (AlN) may be formed on the membrane layer 140. The seed layer may be disposed between the membrane layer 140 and the first electrode 150. The seed layer may be formed using a dielectric material or a metal having an HCP crystalline structure, instead of aluminum nitride (AlN). As an example, when the seed layer is a metal, the seed layer may be formed of titanium (Ti).

However, the seed layer is not limited to the examples provided above, and when the seed layer is formed of a material having low reactivity with an etching gas, the membrane layer 140 may be removed. In other words, the seed layer may replace the membrane layer 140.

The first electrode 150 may be formed on the membrane layer 140, and a portion of the first electrode 150 may be disposed on the cavity C. The first electrode 150 may be configured as either one of an input electrode and an output electrode that may input and output, respectively, an electrical signal such as a radio frequency (RF) signal, and the like.

The first electrode 150 may be formed of an aluminum alloy material containing scandium (Sc). Since the first electrode 150 is formed of an aluminum alloy material containing scandium (Sc), mechanical strength may increase such that high power reactive sputtering may be available to form the first electrode 150. Under the deposition condition described above, an increase of roughness of a surface of the first electrode 150 may be reduced or prevented, and highly-oriented growth of the piezoelectric layer 160 may be induced.

Also, since the first electrode 150 contains scandium (Sc), chemical resistance of the first electrode 150 may increase such that an issue that may occur when the first electrode is formed of pure aluminum may be mitigated. Further, in a manufacturing process, process stability of a dry etching process or a wet process may be provided. Also, when the first electrode is formed of pure aluminum, oxidation may easily occur. However, since the first electrode 150 is formed of an aluminum alloy material containing scandium, chemical resistance against oxidation may improve.

However, the first electrode 150 is not limited to the foregoing examples, and the first electrode 150 may be formed of a conductive material such as molybdenum (Mo) or an alloy of Mo, for example. Also, the first electrode 150 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys of Ru, W, Ir, Pt, Cu, Ti, Ta, Ni, or Cr.

The piezoelectric layer 160 may be configured to cover at least the portion of the first electrode 150 disposed on the cavity C. The piezoelectric layer 160 may be a layer configured to generate a piezoelectric effect of converting electrical energy into mechanical energy having an elastic wave form, and may include an aluminum nitride (AlN) material, for example.

The piezoelectric layer 160 may be doped with a dopant such as a rare earth metal or a transition metal. As an example, the rare earth metal used as a dopant may include any one or any combination of any two or more of scandium (Sc), erbium (Er), yttrium (Y), and lanthanum (La). Further, the transition metal used as a dopant may include any one or any combination of any two or more of titanium (Ti), zirconium (Zr), hafnium (Hf), tantalum (Ta), and niobium (Nb). Also, the piezoelectric layer 160 may include magnesium (Mg), which is a divalent metal.

The second electrode 170 may cover at least a portion of the piezoelectric layer 160 disposed on the cavity C. The second electrode 170 may be configured as either one of an input electrode and an output electrode that may input and output, respectively, an electrical signal such as a radio frequency (RF) signal. When the first electrode 150 is configured as an input electrode, the second electrode 170 may be configured as an output electrode. When the first electrode 150 is configured as an output electrode, the second electrode 170 may be configured as an input electrode.

However, the second electrode 170 is not limited to the foregoing examples, and the second electrode 170 may be formed of a conductive material such as molybdenum (Mo) or an alloy of Mo, for example. Additionally, the second electrode 170 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys of Ru, W, Ir, Pt, Cu, Ti, Ta, Ni, or Cr.

The insertion layer 180 may be disposed between the first electrode 150 and the piezoelectric layer 160. The insertion layer 180 may be formed of a dielectric material such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), titanium oxide ($TiO_2$), zinc oxide (ZnO), or the like, and may be formed of a material different from that of the piezoelectric layer 160. Also, if desired, a region in which the insertion layer 180 is disposed may instead be formed of an empty space (air). The empty space may be implemented by removing the insertion layer 180. Further, the insertion layer 180 may be formed of a metal material, such as aluminum (Al), titanium (Ti), or the like.

As an example, the insertion layer 180 may be disposed along the membrane layer 140, the first electrode 150, and a surface of the etch stop portion 130. Also, at least a portion of the insertion layer 180 may be disposed between the piezoelectric layer 160 and the first electrode 150.

The passivation layer 190 may be formed in a region excluding a portion of each of the first electrode 150 and the second electrode 170. The passivation layer 190 may prevent the first electrode 150 and the second electrode 170 from being damaged in a manufacturing process.

The passivation layer 190 may be partially removed by an etching process to adjust a frequency characteristic in a final manufacturing process. Accordingly, a thickness of the passivation layer 190 may be adjusted. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the passivation layer 190, for example.

A metal pad 200 may be formed on a portion of each of the first electrode 150 and the second electrode 170 in which the passivation layer 190 is not formed. As an example, the metal pad 200 may be formed of a material such as gold (Au), a gold-tin (Au—Sn) alloy, copper (Cu), a copper-tin (Cu—Sn) alloy, and aluminum (Al), or an aluminum alloy. For example, the aluminum alloy may be an aluminum-germanium (Al—Ge) alloy.

The metal pad 200 may include a first metal pad 202 connected to the first electrode 150 and a second metal pad 204 connected to the second electrode 170.

The protective layer 210 may cover at least the metal pad 200. In other words, the protective layer 210 may be configured to cover at least a surface of the metal pad 200. The protective layer 210 may be disposed outside of an active region. The active region is, for example, a region in which the first electrode 150, the piezoelectric layer 160, and the second electrode 170 overlap one another. In other words, the protective layer 210 may not be disposed in the active region.

As an example, the protective layer 210 may be formed of a material that may not be easily trimmed in a trimming process in comparison to the passivation layer 190, or the protective layer 210 may have a thickness greater than that of the passivation layer 190.

The protective layer 210 may be formed of any one of aluminum oxide ($Al_2O_3$), aluminum nitride (AlN), silicon nitride (SiN), and silicon oxide ($SiO_2$). As an example, when the metal pad 200 is formed of a gold (Au) material, the protective layer 210 may be formed of either one of aluminum oxide ($Al_2O_3$) and aluminum nitride (AlN).

As described above, since the protective layer 210 is formed to cover the metal pad 200, by-products of the passivation layer 190 removed in a process of trimming passivation layer 190 may be prevented from being stacked on an internal side surface of the metal pad 200.

Further, after the trimming process is completed, a thickness of the passivation layer 190 may be prevented from being non-uniformly formed in an active region.

More specifically, generally, a process of trimming the passivation layer 190 may be performed using a stencil mask. However, when a trimming process is performed using a stencil mask, there may be a disadvantage in terms of accuracy in process implementation, representation properties, and flexibility in design due to degradation of a degree of arrangement and representation properties of a device, a stencil mask, and a trimming device, an ion beam shadow effect caused by a gap between a bulk acoustic resonator and a stencil mask, and an ion beam shadow effect caused by exposure of a layer other than a layer which needs a trimming process.

Alternatively, when a trimming process is performed using a photoresist, it may be difficult to perform a uniform masking process due to a difference in shapes of bulk acoustic resonators in different positions in a wafer, which may be a disadvantage. Also, in the case in which a uniform masking process is not performed, a surface potential may be non-uniform in a trimming region due to a difference in surface potential between the metal pad 200 and the passivation layer 190. Accordingly, the trimming may not be uniformly performed in a trimming process using argon ions.

Further, when a trimming process is performed using a photoresist, there may be an issue in which by-products of the passivation layer 190 created in a trimming process, which are by-products created by removed portions of the passivation layer 190, may be stacked on an internal side surface of the metal pad 200.

However, in the example embodiment described herein, the protective layer 210 may be configured to cover a surface of the metal pad 200. Accordingly, by-products of the portions of the passivation layer 190 removed in a trimming process may be prevented from being stacked on an internal side surface of the metal pad 200, and a thickness of the passivation layer 190 may be prevented from being non-uniformly formed in an active region after the trimming process is completed.

As described above, by-products of portions of the passivation layer 190 removed in the trimming process may be prevented from being stacked on an internal side surface of the metal pad 200 through the protective layer 210, and a thickness of the passivation layer 190 may be prevented from being non-uniformly formed in an active region after the trimming process is completed.

In the description below, modified embodiments of a bulk acoustic resonator will be described. For conciseness, the detailed descriptions of elements that are the same as those of the embodiment of FIGS. 1 to 3 will not be repeated.

Figure 4:
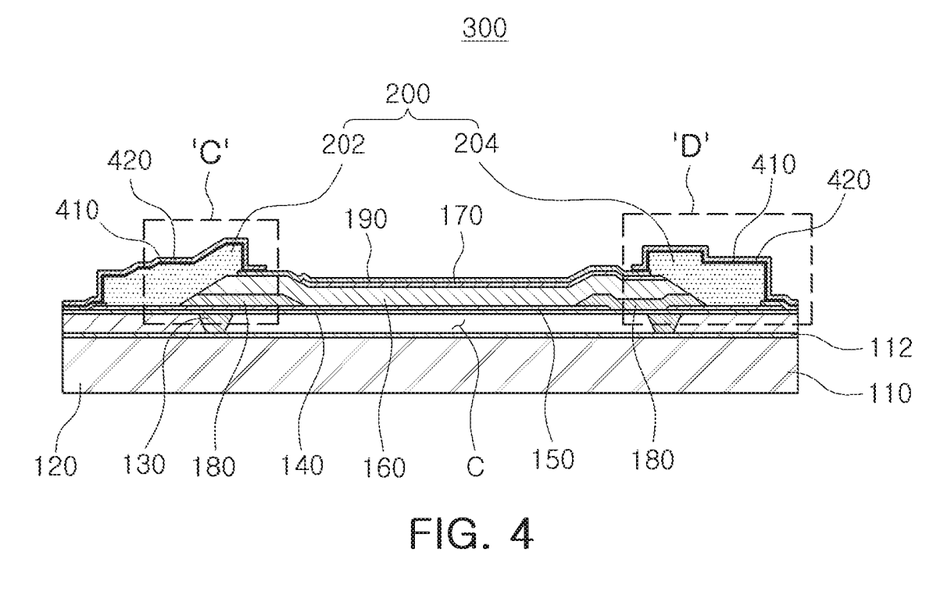
FIG. 4 is a cross-sectional diagram illustrating a bulk acoustic resonator, according to an embodiment.
Figure 5:
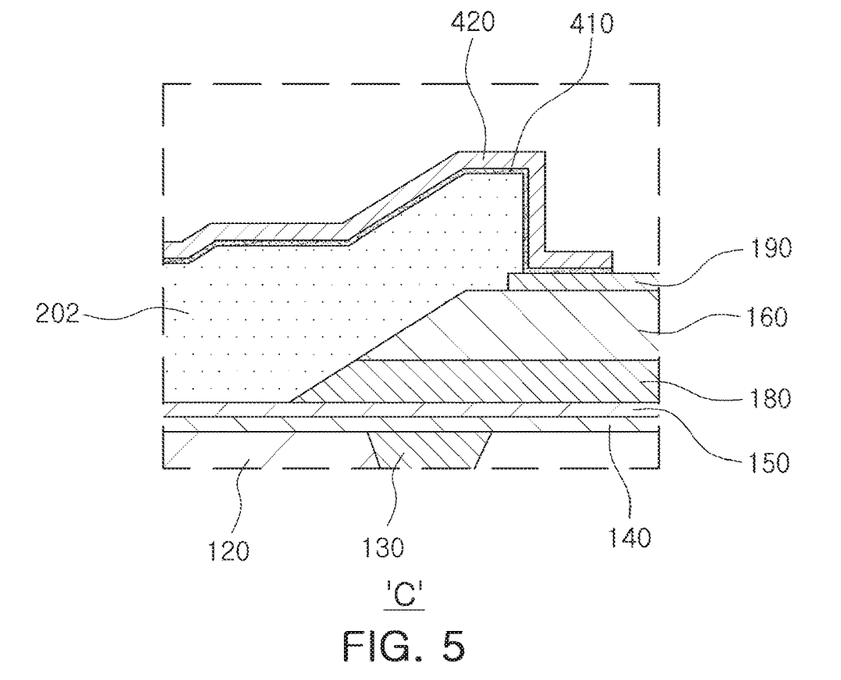
FIG. 5 is an enlarged diagram illustrating portion C of FIG. 4.
Figure 6:
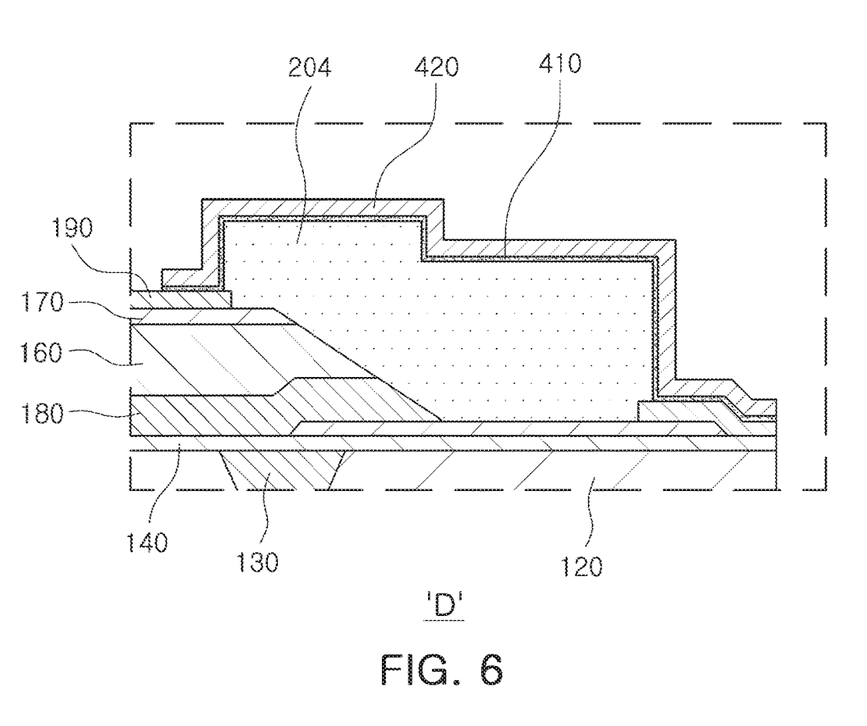
FIG. 6 is an enlarged diagram illustrating portion D of FIG. 4.

FIG. 4 is a cross-sectional diagram illustrating a bulk acoustic resonator 300, according to an embodiment. FIG. 5 is an enlarged diagram illustrating portion C of FIG. 4. FIG. 6 is an enlarged diagram illustrating portion D of FIG. 4.

Referring to FIGS. 4 to 6, the bulk acoustic resonator 300 may include, for example, the substrate 110, the sacrificial layer 120, the etch stop portion 130, the membrane layer 140, the first electrode 150, the piezoelectric layer 160, the second electrode 170, the insertion layer 180, the passivation layer 190, the metal pad 200, an adhesive layer 410, and a protective layer 420.

The substrate 110, the sacrificial layer 120, the etch stop portion 130, the membrane layer 140, the first electrode 150, the piezoelectric layer 160, the second electrode 170, the insertion layer 180, the passivation layer 190, and the metal pad 200 may be the same as described with respect to FIGS. 1 to 3, and thus, detailed descriptions of these elements will not be repeated.

The adhesive layer 410 may allow a protective layer 420 to be easily layered on a surface of the metal pad 200. The adhesive layer 410 may be layered on the surface of the metal pad 200. In other words, the adhesive layer 410 may be disposed between the protective layer 420 and the metal pad 200. The adhesive layer 410 may be formed of either one of aluminum oxide ($Al_2O_3$) and aluminum nitride (AlN), for example.

The protective layer 420 may be disposed to cover at least the adhesive layer 410. In other words, the protective layer 420 may be configured to cover at least the adhesive layer 410 layered on at least a surface of the metal pad 200. The protective layer 420 may be disposed outside of an active region. In other words, the protective layer 420 may not be disposed in the active region.

As an example, the protective layer 420 may be formed of a material that may not be easily trimmed in a trimming process in comparison to the passivation layer 190, or the protective layer 410 may have a thickness greater than that of the passivation layer 190.

The protective layer 420 may be formed of either one of silicon nitride (SiN) and silicon oxide ($SiO_2$). As an example, when the metal pad 200 is formed of a gold (Au) material and the adhesive layer 410 is formed of either one of aluminum oxide ($Al_2O_3$) and aluminum nitride (AlN), the protective layer 410 may be formed of either one of silicon nitride (SiN) and silicon oxide ($SiO_2$).

As described above, since the protective layer 420 is formed to cover the metal pad 200, by-products of portions of the passivation layer 190 removed in a process of trimming passivation layer 190 may be prevented from being stacked on an internal side surface of the metal pad 200.

Further, after the trimming process is completed, a thickness of the passivation layer 190 may be prevented from being non-uniformly formed in an active region.

Figure 7:
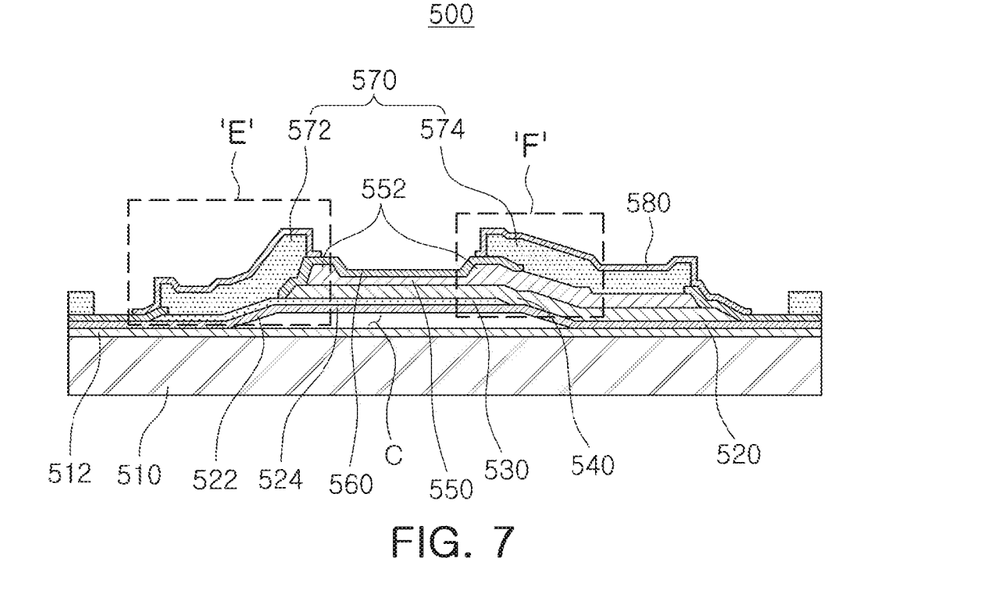
FIG. 7 is a cross-sectional diagram illustrating a bulk acoustic resonator, according to an embodiment.
Figure 8:
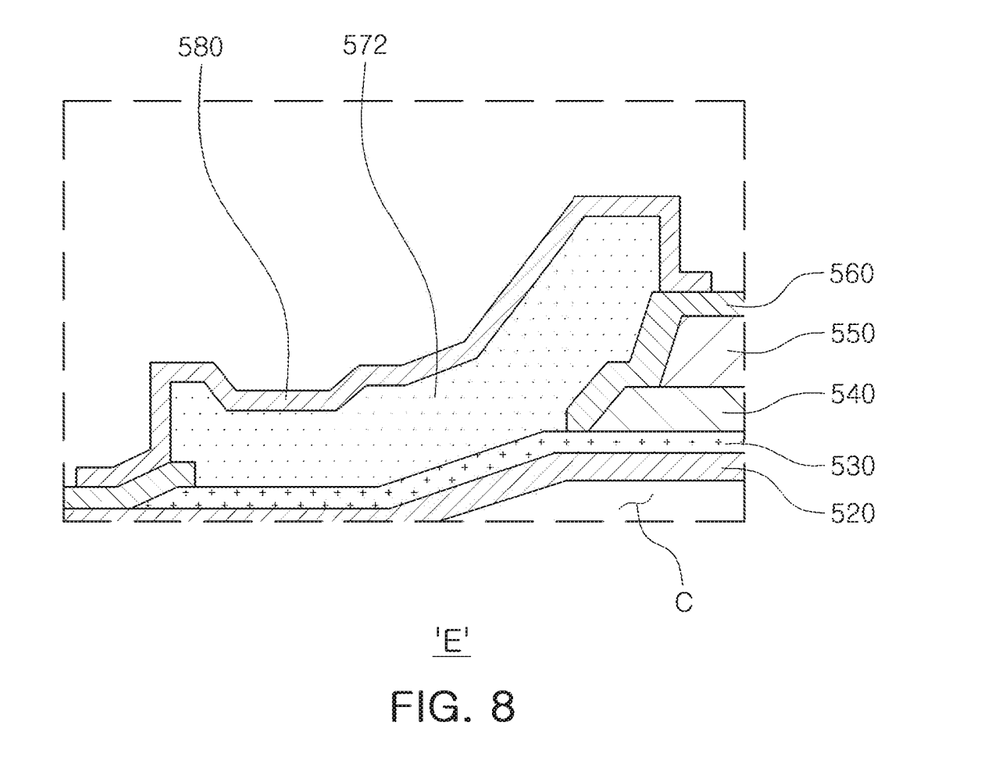
FIG. 8 is an enlarged diagram illustrating portion E of FIG. 7.
Figure 9:
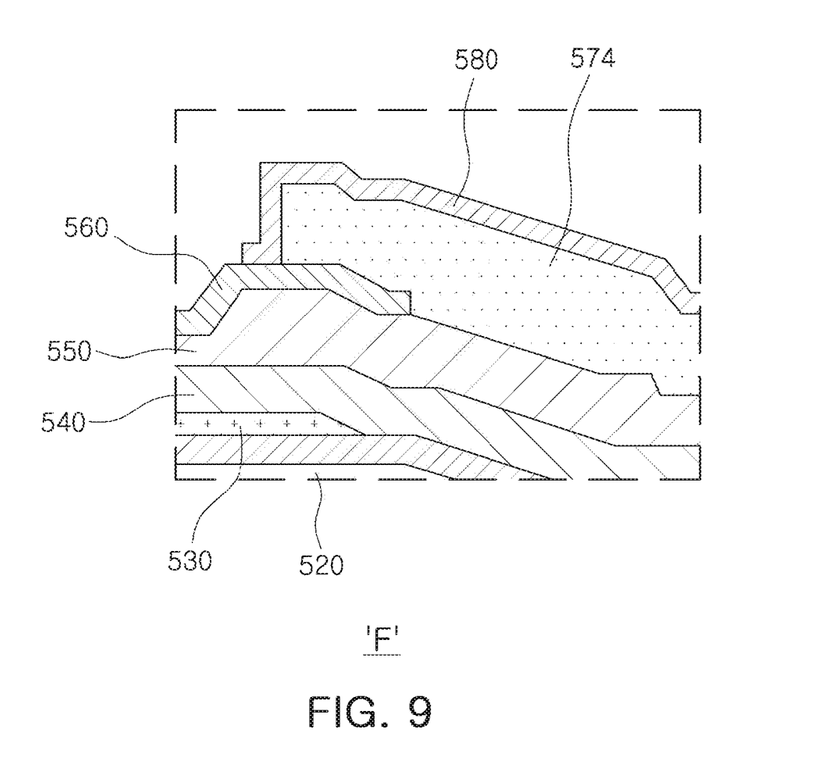
FIG. 9 is an enlarged diagram illustrating portion F of FIG. 7.

FIG. 7 is a cross-sectional diagram illustrating a bulk acoustic resonator 500, according to an embodiment. FIG. 8 is an enlarged diagram illustrating portion E of FIG. 7. FIG. 9 is an enlarged diagram illustrating portion F of FIG. 7.

Referring to FIGS. 7 and 9, the bulk acoustic resonator 500 may include, for example, a substrate 510, a membrane layer 520, a first electrode 530, a piezoelectric layer 540, a second electrode 550, a passivation layer 560, a metal pad 570, and a protective layer 570.

The substrate 510 may be a silicon substrate. For example, a silicon wafer may or a silicon on insulator (SOI) type substrate may be used as the substrate 510.

An insulating layer 512 may be formed on an upper surface of the substrate 510, and the insulating layer 512 may electrically isolate elements disposed on an upper surface of the substrate 510 from the substrate 510. Also, when the insulating layer 512 forms a cavity C in a manufacturing process, the insulating layer 512 may prevent the substrate 510 from being etched by an etching gas.

In this example, the insulating layer 512 may be formed of any one or any combination of any two or more of silicon oxide ($SiO_2$), silicon nitride ($Si_3N_4$), aluminum oxide ($Al_2O_3$), and aluminum nitride (AlN), and may be formed through any one of a chemical vapor deposition process, an RF magnetron sputtering process, and an evaporation process.

The membrane layer 520 may form a cavity C with the substrate 510. The membrane layer 520 may also be formed of a material having low reactivity with an etching gas when a sacrificial layer (not illustrated) is removed. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), may be used as the membrane layer 520, for example.

A seed layer (not illustrated) formed of aluminum nitride (AlN) may be formed on the membrane layer 520. The seed layer may be disposed between the membrane layer 520 and the first electrode 550. The seed layer may be formed using a dielectric material or a metal having an HCP crystalline structure, instead of aluminum nitride (AlN). As an example, when the seed layer is a metal, the seed layer may be formed of titanium (Ti).

The membrane layer 520 may include an inclined portion 522 disposed slantingly with respect to the upper surface of the substrate 510 (e.g., a horizontal direction), and a plane portion (e.g., a level or horizontal portion) 524 disposed in an active region in which the first electrode 530, the piezoelectric layer 540, and the second electrode 550 overlap one another. The plane portion 524 may be disposed parallel to the upper surface of the substrate 510.

The first electrode 530 may be formed on the membrane layer 520, and a portion of the first electrode 530 may be disposed on a cavity C. Also, the first electrode 530 may be configured as either one of an input electrode and an output electrode which may input and output, respectively, an electrical signal such as a radio frequency (RF) signal, and the like.

The first electrode 530 may be formed of a conductive material such as molybdenum (Mo) or an alloy of Mo, for example. However, the first electrode 530 is not limited to the foregoing example, and the first electrode 530 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys of Ru, W, Ir, Pt, Cu, Ti, Ta, Ni, or Cr.

The piezoelectric layer 540 may be configured to cover at least the portion of the first electrode 530 disposed on the cavity C. The piezoelectric layer 540 may be a layer configured to generate a piezoelectric effect of converting electrical energy into mechanical energy having an elastic wave form, and may be formed of an aluminum nitride (AlN), zinc oxide (ZnO), or lead zirconate titanate (PZT; PbZrTiO), for example. When the piezoelectric layer 540 is formed of aluminum nitride (AlN), the piezoelectric layer 540 may further include a rare earth metal or a transition metal. As an example, the rare earth metal may include any one or any combination of any two or more of scandium (Sc), erbium (Er), yttrium (Y), and lanthanum (La). Also, as an example, the transition metal may include any one or any combination of any two or more of tantalum (Ta), zirconium (Zr), hafnium (Hf), tantalum (Ta), and niobium (Nb). Also, magnesium (Mg), which is a divalent metal, may be included.

The second electrode 550 may cover at least a portion of the piezoelectric layer 540 disposed on the cavity C. The second electrode 550 may be configured as either one of an input electrode and an output electrode which may input and output, respectively, an electrical signal such as a radio frequency (RF) signal. When the first electrode 530 is configured as an input electrode, the second electrode 550 may be configured as an output electrode. When the first electrode 530 is configured as an output electrode, the second electrode 550 may be configured as an input electrode.

The second electrode 550 may be formed using a conductive material such as molybdenum (Mo) or an alloy of Mo, for example. However, the second electrode 550 is not limited to the foregoing example. The second electrode 550 may be formed of a conductive material such as ruthenium (Ru), tungsten (W), iridium (Ir), platinum (Pt), copper (Cu), titanium (Ti), tantalum (Ta), nickel (Ni), chromium (Cr), or the like, or alloys of Ru, W, Ir, Pt, Cu, Ti, Ta, Ni, or Cr.

A frame 552 disposed on an edge of the active region may be included in the second electrode 550.

The passivation layer 560 may be formed in a region excluding a portion of each of the first electrode 530 and the second electrode 550. The passivation layer 560 may prevent the first electrode 530 and the second electrode 550 from being damaged in a manufacturing process.

The passivation layer 560 may be partially removed by an etching process to adjust a frequency characteristic in a final manufacturing process. Accordingly, a thickness of the passivation layer 560 may be adjusted. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the passivation layer 560, for example.

The metal pad 570 may be connected to the first electrode 530 and the second electrode 550 exposed from the passivation layer 560. As an example, the metal pad 570 may be formed of a material such as gold (Au), a gold-tin (Au—Sn) alloy, copper (Cu), a copper-tin (Cu—Sn) alloy, and aluminum (Al), or an aluminum alloy. For example, the aluminum alloy may be an aluminum-germanium (Al—Ge) alloy.

The metal pad 570 may include a first metal pad 572 connected to the first electrode 530 and a second metal pad 574 connected to the second electrode 550.

The protective layer 580 may cover at least the metal pad 570. In other words, the protective layer 580 may be configured to cover a surface of the metal pad 570. The protective layer 580 may be disposed outside of an active region. Accordingly, the protective layer 580 may not be disposed in then active region.

As an example, the protective layer 580 may be formed of a material which may not be easily trimmed in a trimming process as compared to the passivation layer 190, or the protective layer 580 may have a thickness greater than that of the passivation layer 560.

The protective layer 580 may be formed of any one of aluminum oxide ($Al_2O_3$), and aluminum nitride (AlN), silicon nitride (SiN), and silicon oxide ($SiO_2$). As an example, when the metal pad 570 is formed of a gold (Au) material, the protective layer 580 may be formed of either one of aluminum oxide ($Al_2O_3$) and aluminum nitride (AlN).

Also, as an example, when the metal pad 570 is formed of a gold (Au) material, and an adhesive layer (not illustrated) formed of aluminum oxide ($Al_2O_3$) or aluminum nitride (AlN) is layered on the metal pad 570, the protective layer 580 may be formed of either one of silicon nitride (SiN) and silicon oxide ($SiO_2$).

Since the protective layer 580 covers the metal pad 570, by-products of portions of the passivation layer 560 removed in a process of trimming passivation layer 560 may be prevented from being stacked on an internal side surface of the metal pad 570.

Further, a thickness of the passivation layer 560 may be prevented from being non-uniformly formed in an active region after the trimming process is completed.

Figure 10:
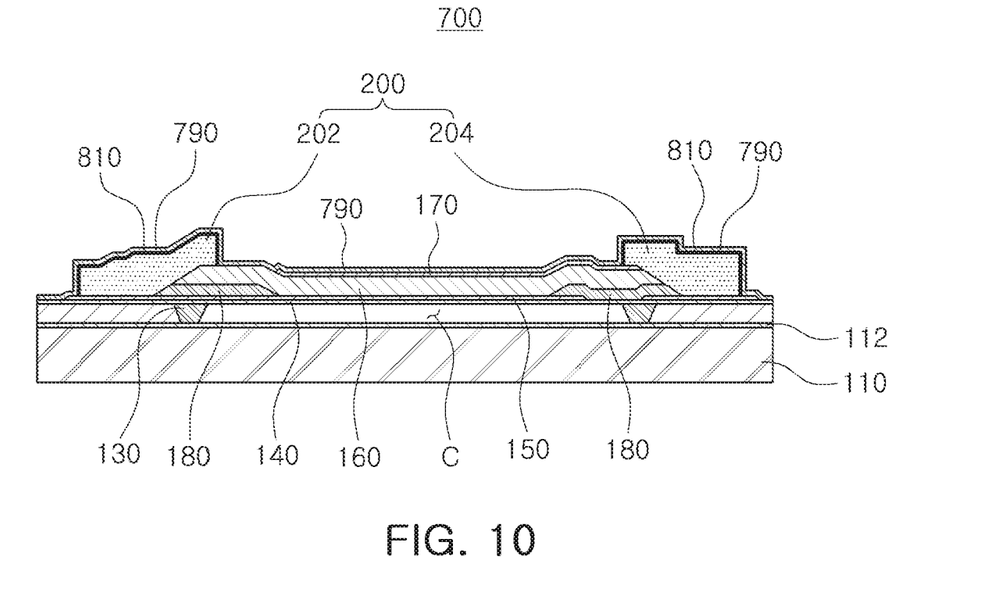
FIG. 10 is a cross-sectional diagram illustrating a bulk acoustic resonator, according to an embodiment.

FIG. 10 is a cross-sectional diagram illustrating a bulk acoustic resonator 700, according to an embodiment.

Referring to FIG. 10, the bulk acoustic resonator 700 may include, for example, the substrate 110, the sacrificial layer 120, the etch stop portion 130, the membrane layer 140, the first electrode 150, a piezoelectric layer 160, the second electrode 170, the insertion layer 180, a passivation layer 790, the metal pad 200, and an adhesive layer 810.

The substrate 110, the sacrificial layer 120, the etch stop portion 130, the membrane layer 140, the first electrode 150, the piezoelectric layer 160, the second electrode 170, the insertion layer 180, and the metal pad 200 may be the same as described in the aforementioned embodiments, and thus, detailed descriptions of these elements will not be repeated.

The adhesive layer 810 may allow the passivation layer 790 to be easily layered on a surface of the metal pad 200. The adhesive layer 810 may be layered on a surface of the metal pad 200. In other words, the adhesive layer 810 may be disposed between the passivation layer 790 and the metal pad 200. The adhesive layer 810 may be formed of an insulating material or a metal material, for example.

The passivation layer 790 may be configured to cover a surface of the bulk acoustic resonator 700. As an example, the passivation layer 790 may be disposed to cover the adhesive layer 810. Further, the passivation layer 790 may be disposed on an upper surface of the second electrode 170 and an upper surface of the piezoelectric layer 160. The passivation layer 790 may function as the protective layer 210 of the bulk acoustic resonator 100 described above.

The passivation layer 790 may be partially removed by an etching process to adjust a frequency in a final manufacturing process. Accordingly, a thickness of the passivation layer 790 may be adjusted. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the passivation layer 790, for example.

Figure 11:
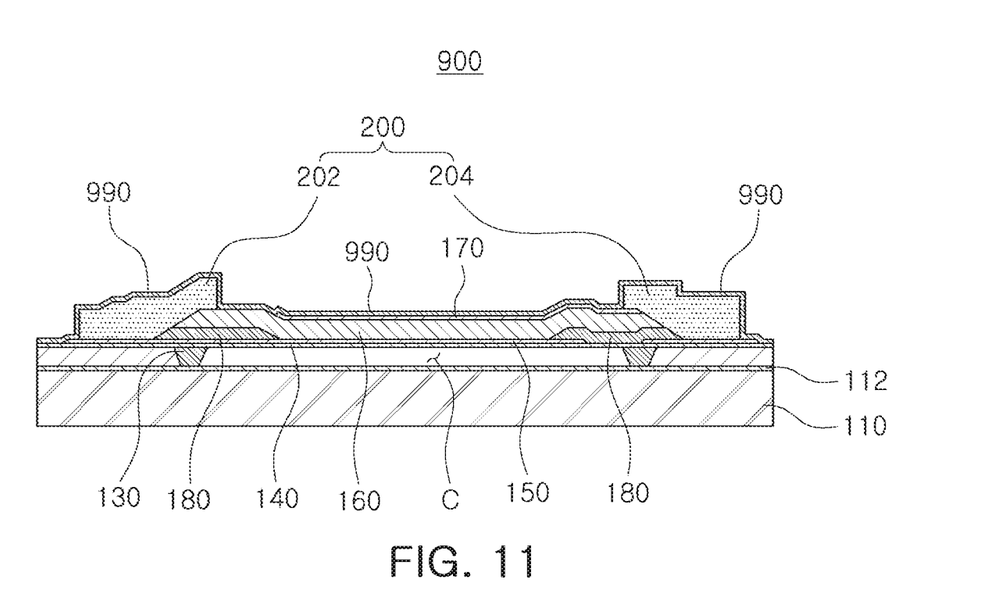
FIG. 11 is a cross-sectional diagram illustrating a bulk acoustic resonator, according to an embodiment.

FIG. 11 is a cross-sectional diagram illustrating a bulk acoustic resonator 900, according to an embodiment.

Referring to FIG. 11, the bulk acoustic resonator 900 may include, for example, the substrate 110, the sacrificial layer 120, the etch stop portion 130, the membrane layer 140, the first electrode 150, the piezoelectric layer 160, the second electrode 170, the insertion layer 180, a passivation layer 990, and the metal pad 200.

The substrate 110, the sacrificial layer 120, the etch stop portion 130, the membrane layer 140, the first electrode 150, the piezoelectric layer 160, the second electrode 170, the insertion layer 180, and the metal pad 200 may be the same as described in the aforementioned embodiments, and thus, detailed descriptions of these elements will not be repeated.

The passivation layer 990 may be configured to cover a surface of the bulk acoustic resonator 900. As an example, the passivation layer 990 may be disposed to cover the first electrode 150, the second electrode 170, the piezoelectric layer 160, the membrane layer 140, and the metal pad 200. The passivation layer 990 may function as the protective layer 210 of the bulk acoustic resonator 100 described above.

The passivation layer 990 may be partially removed by an etching process to adjust a frequency characteristic in a final process. Accordingly, a thickness of the passivation layer 990 may be adjusted. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the passivation layer 990, for example.

The embodiments described herein may provide an effect of preventing by-products of portions of a passivation layer that are removed in a trimming process from being stacked on an internal side surface of a metal pad.

The embodiments described herein may also provide an effect of preventing a thickness of the passivation layer from being non-uniformly formed in an active region after a trimming process is completed.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. In addition, respective embodiments may be combined with each other. For example, the pressing members disclosed in the above-described embodiments may be used in combination with each other in one force sensing device. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic resonator, comprising:
   a substrate;
   a first electrode disposed on the substrate;
   a piezoelectric layer disposed to cover at least a portion of the first electrode;
   a second electrode disposed to cover at least a portion of the piezoelectric layer;
   a metal pad connected to the first electrode and the second electrode;
   a protective layer disposed to cover an upper surface of the metal pad, and
   a passivation layer disposed to extend below the protective layer.

2. The bulk acoustic resonator of claim 1, wherein the protective layer is formed of any one of aluminum oxide ($Al_2O_3$), aluminum nitride (AlN), silicon nitride (SiN), and silicon oxide ($SiO_2$).

3. The bulk acoustic resonator of claim 1, wherein the protective layer is disposed outside of an active region in which the first electrode, the piezoelectric layer, and the second electrode overlap one another.

4. The bulk acoustic resonator of claim 3, wherein the protective layer is disposed only outside of the active region.

5. The bulk acoustic resonator of claim 1, further comprising:
   an adhesive layer disposed between the protective layer and the metal pad.

6. The bulk acoustic resonator of claim 5, wherein the adhesive layer is formed of any one of aluminum oxide ($Al_2O_3$) and aluminum nitride (AlN), and
   wherein the protective layer is formed of any one of silicon nitride (SiN) and silicon oxide ($SiO_2$).

7. The bulk acoustic resonator of claim 1, further comprising:
   an insertion layer disposed between the first electrode and the piezoelectric layer.

8. The bulk acoustic resonator of claim 1, further comprising:
   a membrane layer forming a cavity with the substrate.

9. The bulk acoustic resonator of claim 8, wherein the membrane layer includes an inclined portion disposed slantingly with respect to a surface of the substrate on which the membrane layer is disposed, and a plane portion disposed parallel to the upper surface of the substrate, in an active region in which the first electrode, the piezoelectric layer, and the second electrode overlap one another.

10. The bulk acoustic resonator of claim 9, wherein the second electrode includes a frame disposed on an edge of the active region and having a thickness greater than a thickness of other portions of the second electrode.

11. The bulk acoustic resonator of claim 8, wherein the substrate includes at least an insulating layer disposed below the cavity.

12. The bulk acoustic resonator of claim 8, further comprising:
   an etch stop portion disposed to surround the cavity; and
   a sacrificial layer disposed to surround the etch stop portion.

13. The bulk acoustic resonator of claim 1, wherein the metal pad comprises a first metal pad connected to the first electrode, and a second metal pad connected to the second electrode.

14. The bulk acoustic resonator of claim 1, wherein the passivation layer is disposed to cover the second electrode and a portion of the piezoelectric layer disposed on an external side of the first electrode.

15. The bulk acoustic resonator of claim 1, wherein the protective layer covers the metal pad from an exterior of the bulk acoustic resonator.

16. The bulk acoustic resonator of claim 15, wherein the protective layer completely covers the metal pad from the exterior of the bulk acoustic resonator.

17. A bulk acoustic resonator, comprising:
   a substrate;
   a first electrode disposed on the substrate;
   a piezoelectric layer disposed to cover at least a portion of the first electrode;
   a second electrode disposed to cover at least a portion of the piezoelectric layer;
   a metal pad connected to the first electrode and the second electrode;
   a protective layer disposed to cover an upper surface of the metal pad;
   a passivation layer, disposed to extend below the protective layer, and disposed to cover the second electrode, a portion of the piezoelectric layer disposed on an external side of the second electrode, and an upper surface of the metal pad.

18. The bulk acoustic resonator of claim 17, further comprising:
   an adhesive layer disposed between the metal pad and the passivation layer.

19. The bulk acoustic resonator of claim 18, wherein the adhesive layer is formed of an insulating material or a metal material.

20. The bulk acoustic resonator of claim 17, wherein the passivation layer is formed of a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

21. The bulk acoustic resonator of claim 20, further comprising:
   an adhesive layer disposed between the metal pad and the passivation layer, and formed of either one of aluminum oxide ($Al_2O_3$) and aluminum nitride (AlN).

* * * * *